United States Patent [19]

Sano

[11] 4,340,867

[45] Jul. 20, 1982

[54] INVERTER AMPLIFIER

[75] Inventor: Jun-ichi Sano, Chelmsford, Mass.

[73] Assignee: GTE Laboratories Incorporated, Waltham, Mass.

[21] Appl. No.: 204,092

[22] Filed: Nov. 5, 1980

[51] Int. Cl.³ ............................................... H03F 3/16
[52] U.S. Cl. ..................................... 330/277; 330/296; 307/448
[58] Field of Search ...................... 330/277, 296, 300; 307/448, 450, 205, 214

[56] References Cited

FOREIGN PATENT DOCUMENTS 55-45260  3/1980  Japan ................................. 330/277

Primary Examiner—James B. Mullins
Assistant Examiner—Gene Wan
Attorney, Agent, or Firm—David M. Keay

[57] ABSTRACT

An inverter amplifier employing NMOS FET's having a plurality of capacitance coupled inverter amplifier stages arranged in series. A DC bias is provided at the input of each amplifier stage by a DC bias generator of a reference voltage source, an operational amplifier, and a reference inverter arranged in a negative feedback loop. The DC bias generator is applied to the input of each amplifier stage.

18 Claims, 1 Drawing Figure

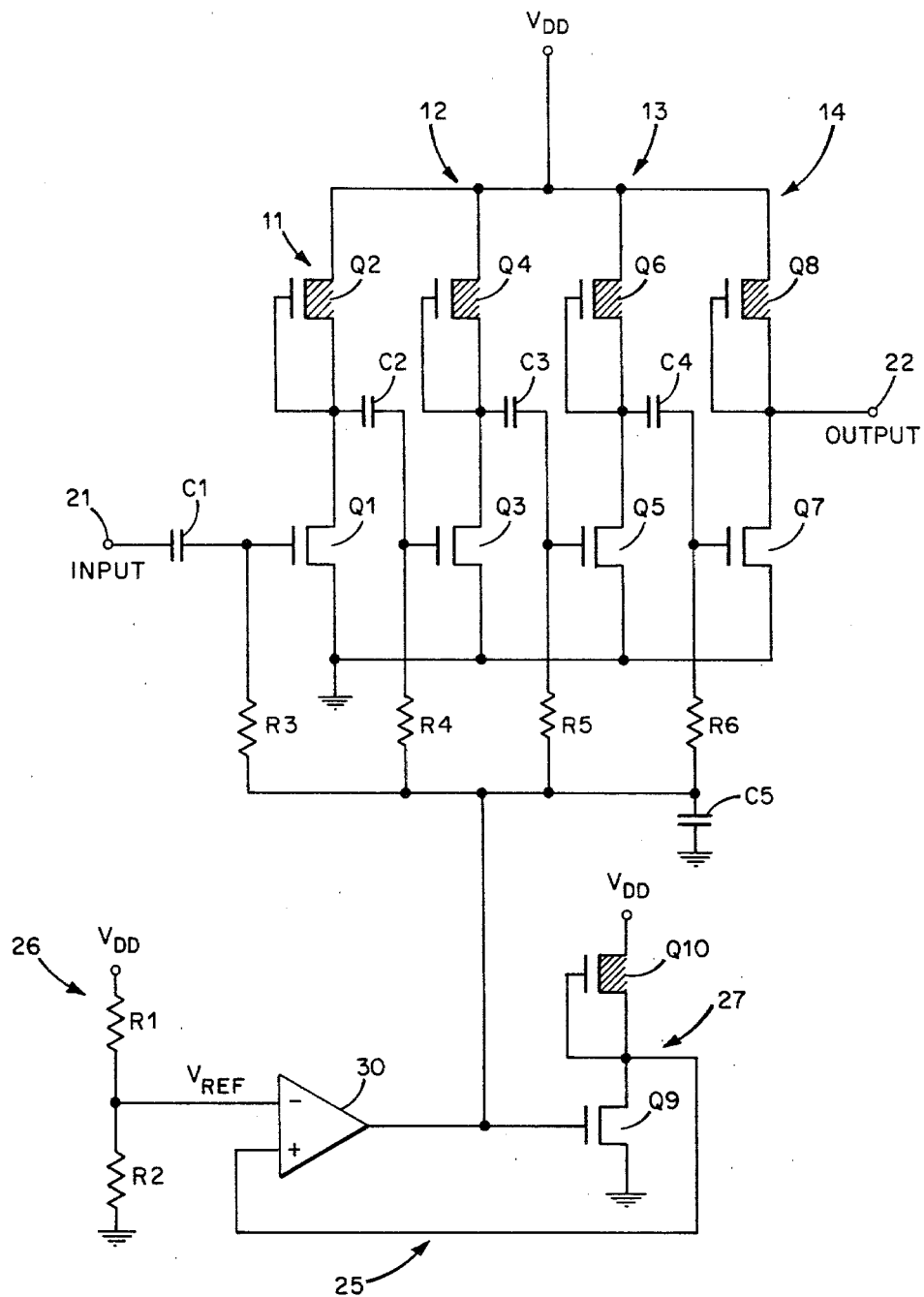

INVERTER AMPLIFIER

BACKGROUND OF THE INVENTION

This invention relates to amplifiers employing field effect transistors (FET). More particularly, it is concerned with metal-oxide-silicon (MOS) inverter amplifiers having DC biasing at the input.

Inverter amplifiers employing MOS FET's arranged in a series of inverter amplifier stages with capacitive coupling to their inputs are well-known. These circuits employ DC biasing at the input to each stage. It is desirable that the DC biasing voltage under quiescent conditions be approximately one-half of the supply voltage. With this biasing condition the amplifier can be operated at near maximum gain with maximum dynamic range and good linearity.

DC biasing of an MOS inverter amplifier can be obtained by connecting the input of an inverter stage to its output with a high impedance so that the input voltage is equal to the output voltage. Theoretically, with this arrangement the quiescent output voltage is in the middle of the transfer curve where the gain is near maximum, dynamic range is large, and linearity is good. However, if the gain of an inverter stage is to be large, the ratio of the dimensions of the two FET's of the stage are such that the transfer curve of the stage causes the quiescent output voltage to lie on the transfer curve at a point where the gain is not as high, the dynamic range is low, and the linearity is not as great. Furthermore, even with FET's designed so that theoretically the quiescent output voltage is in the middle of the transfer curve, variations in the parameters of the devices due to variations in processing and in ambient conditions cause the actual DC biasing point to shift away from the design point with consequent deterioration of the operating characteristics.

SUMMARY OF THE INVENTION

Amplifiers in accordance with the present invention are provided with appropriate DC biasing conditions regardless of variations in device parameters and changes in ambient conditions. The amplifier includes an input connection for receiving input signals and an amplifier field effect transistor which has a first conduction path electrode (source or drain) coupled to a source of operating potential and a second conduction path electrode connected to a point of fixed potential. The input connection is coupled to the gate of the amplifier field effect transistor, and an output connection is coupled to the first conduction path electrode of the amplifier field effect transistor. The amplifier includes a DC bias generating means for establishing a DC bias at the input of the amplifier. The DC bias generating means includes a reference field effect transistor which has a first conduction path electrode coupled to the source of operating potential and a second conduction path electrode connected to the point of fixed potential. An operational amplifier has a first input which is connected to the first conduction path electrode of the reference field effect transistor. A source of reference potential for producing a reference voltage is connected to the second input of the operational amplifier. The output of the operational amplifier is coupled to the gate of the reference field effect transistor and also to the gate of the amplifier field effect transistor.

BRIEF DESCRIPTION OF THE DRAWING

The single FIGURE of the drawing is a schematic circuit diagram illustrate an exemplary four-stage inverter amplifier employing a DC bias generating arrangement in accordance with the present invention.

For a better understanding of the present invention, together with other and further objects, advantages, and capabilities thereof, reference is made to the following discussion and appended claims in connection with the above-described drawing.

DETAILED DESCRIPTION OF THE INVENTION

The single FIGURE of the drawing illustrates an exemplary MOS FET inverter amplifier in accordance with the present invention. In the circuit illustrated all of the FET devices are N channel enhancement and depletion devices. It is particularly desirable that the circuit as illustrated be fabricated as an integrated circuit in a single body of semiconductor material. Thus, the processing parameters for all the devices are identical, and their characteristics will track very closely.

As illustrated the amplifier employs four inverter amplifier stages 11, 12, 13, and 14, each stage employing a depletion type FET and an enhancement type FET. The amplifier is capacitance coupled having a first input capacitance C1 connected between the input terminal 21 and the first inverter stage 11. The first inverter stage 11 includes an enhancement type FET Q1 and a depletion type FET Q2 is connected in series. One conduction path electrode of FET Q2 is connected directly to the supply voltage $V_{DD}$. The other conduction path electrode is connected directly to one of the conduction path electrodes of FET Q1. The other conduction path electrode of FET Q1 is connected directly to ground. The gate of FET Q1 is connected to the input terminal 21 through the input capacitance C1. The gate of FET Q2 is connected to the juncture of the two FET's Q1 and Q2. This juncture also serves as the output connection for the stage.

A capacitance C2 couples the output of the first inverter amplifier stage 11 to the second stage 12. The second, third, and fourth amplifier stages, as shown in the FIGURE, are similar to the first stage. Capacitance C3 couples the output of the second stage 12 to the input of the third stage 13, and capacitance C4 couples the third stage 13 to the input of the fourth stage 14. The output of the circuit is taken at an output terminal 22 connected to the juncture of FET's Q7 and Q8 of the last stage 14. The portion of the inverter amplifier circuit as described hereinabove is similar to conventional capacitance coupled MOS FET inverter amplifiers.

In accordance with the present invention the amplifier includes a DC bias generator 25. The DC bias generator 25 includes a source of reference voltage 26 for producing a desired reference voltage $V_{REF}$. The reference voltage source 26 as shown includes a voltage divider of two resistances R1 and R2 connected in series between the supply voltage $V_{DD}$ and ground. The reference voltage $V_{REF}$ is applied to the negative input of an operational amplifier 30. The operational amplifier may be a standard, conventional MOS FET operational amplifier fabricated simultaneously with the other devices as part of the same integrated circuit. There are no stringent requirements for the characteristics of the operational amplifier. It may operate in low speed with relatively poor offset voltage and relatively low gain and still provide satisfactory operation.

The DC bias generator 25 also includes a reference inverter 27 of an enhancement type FET Q9 and a depletion type FET Q10 connected in series. One current path electrode of FET Q10 is connected directly to the supply voltage $V_{DD}$ and its other conduction path electrode is connected to one conduction path electrode of FET Q9. The other conduction path electrode of FET Q9 is connected directly to ground and the gate of FET Q10 is connected to the juncture of the two FET's Q9 and Q10. The ratio of the dimensions of the width and length of the channel of FET Q9 to those of FET Q10 are equal to the ratios of these dimensions between the corresponding FET's of the amplifier stages. The output of the reference inverter 27 at the juncture of FET's Q9 and Q10 is connected directly to the positive input of the operational amplifier 30. The output of the operational amplifier 30 is connected directly to the gate of FET Q9.

The combination of the operational amplifier 30, the reference inverter 27, and the reference voltage source 26 operates as a negative feedback loop. Thus, the operational amplifier 30 automatically produces a voltage to the input of the reference inverter 27 such that the output of the reference inverter 27 becomes $V_{REF}$.

The output of the operational amplifier 30 is also connected to the input of each inverter amplifier stage by way of resistances R3, R4, R5, and R6 of high resistive value in order to reduce the loading effect to previous stages. The high resistive values may be provided by devices other than conventional diffused resistances, for example FET's connected to function as impedances. Thus, the output voltage from the operational amplifier 30 appears as a DC bias voltage at the input to each of the amplifier inverter stages. A decoupling capacitance C5 is connected between the output of the operational amplifier 30 and ground to eliminate the effects of the AC signal between stages. By virtue of the ratios of the dimensions of the FET's of the reference inverter 27 being equal to the ratio of the dimensions of the FET's of the amplifier inverter stages 11, 12, 13, and 14, the DC output voltage of the inverter amplifier is the same as that of the reference inverter 27, $V_{REF}$. Thus, if the reference voltage $V_{REF}$ is $V_{DD/2}$, the DC bias to every stage is such that the quiescent output voltage of each stage is $V_{DD/2}$.

A specific embodiment of the present invention employed all N channel FET's fabricated as an integrated circuit in a single body of semiconductor material. All of the enhancement type FET's including FET Q9 in the reference inverter 27 had a channel width of 15 mils and a channel length of 0.3 mils. All of the depletion type FET's including FET Q10 in the reference inverter 27 had a channel width of 1.5 mils and a channel length of 0.3 mil. The operating voltage $V_{DD}$ was 5 volts, and with equal values of voltage divider resistances R1 and R2 the quiescent output voltage was 2.5 volts.

While there has been shown and described what is considered a preferred embodiment of the present invention, it will be obvious to those skilled in the art that various changes and modifications may be made therein without departing from the invention as defined by the appended claims.

What is claimed is:

1. An amplifier comprising
an input connection for receiving input signals;
an amplifier field effect transistor having a first conduction path electrode coupled to a source of operating potential and a second conduction path electrode connected to a point of fixed potential;
the input connection being coupled to the gate of the amplifier field effect transistor;
an output connection coupled to the first conduction path electrode of the amplifier field effect transistor;
DC bias generating means for establishing a DC bias at the amplifier input including
a reference field effect transistor having a first conduction path electrode coupled to said source of operating potential and a second conduction path electrode connected to said point of fixed potential,
an operational amplifier having a first input connected to the first conduction path electrode of the reference field effect transistor,
a source of reference potential for producing a reference voltage connected to the second input of said operational amplifier,
the output of the operational amplifier being coupled to the gate of the reference field effect transistor and to the gate of the amplifier field effect transistor.

2. An amplifier in accordance with claim 1 including
capacitance means connected between said input connection and the gate of the amplifier field effect transistor; and
a high impedance means connected between the output of the operational amplifier and the gate of the amplifier field effect transistor.

3. An inverter amplifier comprising
an input connection for receiving input signals;
first and second amplifier field effect transistors connected in series between a source of operating potential and a point of fixed potential;
the input connection being coupled to the gate of the first amplifier field effect transistor;
an output connection coupled to the juncture of the first and second amplifier field effect transistors;
DC bias generating means for establishing a DC bias at the inverter amplifier input including
first and second reference field effect transistors connected in series between said source of operating potential and said point of fixed potential,
an operational amplifier having a first input connected to the juncture of the first and second reference field effect transistors,
a source of reference potential for producing a reference voltage connected to the second input of said operational amplifier,
the output of the operational amplifier being coupled to the gate of the first reference field effect transistor and to the gate of the first amplifier field effect transistor.

4. An inverter amplifier in accordance with claim 3 including
capacitance means connected between said input connection and the gate of the first amplifier field effect transistor; and
a high impedance means connected between the output of the operational amplifier and the gate of the first amplifier field effect transistor.

5. An inverter amplifier in accordance with claim 4 wherein the ratios of the dimensions of the first amplifier field effect transistor to the dimensions of the second amplifier field effect transistor are equal to the ratios of the dimensions of the first reference field effect transistor to the dimensions of the second reference field effect transistor.

6. An inverter amplifier in accordance with claim 5 wherein
all of said field effect transistors and said operational amplifier are fabricated as an integrated circuit in a single body of semiconductor material.

7. An inverter amplifier in accordance with claim 3 wherein
the gate of the second amplifier field effect transistor is connected to the juncture of the first and second amplifier field effect transistors; and
the gate of the second reference field effect transistor is connected to the juncture of the first and second reference field effect transistors.

8. An inverter amplifier in accordance with claim 7 wherein
the reference voltage produced by the source of reference potential is equal to one-half of the difference between the potential of the source of operating potential and the potential of the point of fixed potential.

9. An inverter amplifier in accordance with claim 7 wherein the source of reference potential includes
first and second resistance means connected in series between the source of operating potential and the point of fixed potential;
the juncture of the first and second resistance means being connected to the second input of the operational amplifier.

10. An inverter amplifier in accordance with claim 9 wherein
said first and second resistance means are of equal resistive value.

11. An inverter amplifier in accordance with claim 7 wherein
the ratios of the dimensions of the first amplifier field effect transistor to the dimensions of the second amplifier field effect transistor are equal to the ratios of the dimensions of the first reference field effect transistor to the dimensions of the second reference field effect transistor.

12. An inverter amplifier in accordance with claim 11 wherein
all of said field effect transistors and said operational amplifier are fabricated as an integrated circuit in a single body of semiconductor material.

13. An inverter amplifier in accordance with claim 12 wherein
said field effect transistors are N channel metaloxide-silicon field effect transistors.

14. An inverter amplifier in accordance with claim 13 wherein
said first amplifier field effect transistor and said first reference field effect transistor are of the enhancement type; and
said second amplifier field effect transistor and said second reference field effect transistor are of the depletion type.

15. An inverter amplifier in accordance with claim 14 wherein
the first input of the operational amplifier is the positive input; and
the second input of the operational amplifier is the negative input.

16. An inverter amplifier in accordance with claim 12 including
high impedance means connected between the output of the operational amplifier and the gate of the first amplifier field effect transistor.

17. An inverter amplifier in accordance with claim 16 including
third and fourth amplifier field effect transistors connected in series between the source of operating potential and the point of fixed potential;
the gate of the fourth amplifier field effect transistor being connected to the junction of the third and fourth amplifier field effect transistors;
said output connection being coupled to the gate of the third amplifier field effect transistor; and
high impedance means connected between the output of the operational amplifier and the gate of the third amplifier field effect transistor.

18. An inverter amplifier in accordance with claim 17 including
first capacitance means connected between said input connection and the gate of the first amplifier field effect transistor; and
second capacitance means connected between the juncture of the first and second amplifier field effect transistors and the gate of the third amplifier field effect transistor.

* * * * *